US 11,383,207 B2

(12) United States Patent
Aoki et al.

(10) Patent No.: US 11,383,207 B2
(45) Date of Patent: Jul. 12, 2022

(54) HYDROGEN SEPARATION MEMBRANE (71) Applicant: NATIONAL UNIVERSITY CORPORATION HOKKAIDO UNIVERSITY, Sapporo (JP)

(72) Inventors: Yoshitaka Aoki, Hokkaido (JP); Chiharu Kura, Hokkaido (JP); Hiroki Habazaki, Hokkaido (JP)

(73) Assignee: National University Corporation Hokkaido University, Hokkaido (JP)

( * ) Notice: Subject to any disclaimer, the term of this patent is extended or adjusted under 35 U.S.C. 154(b) by 0 days.

(21) Appl. No.: 16/958,835

(22) PCT Filed: Dec. 26, 2018

(86) PCT No.: PCT/JP2018/047935
§ 371 (c)(1),
(2) Date: Jun. 29, 2020

(87) PCT Pub. No.: WO2019/131792
PCT Pub. Date: Jul. 4, 2019

(65) Prior Publication Data
US 2021/0077956 A1    Mar. 18, 2021

(30) Foreign Application Priority Data
Dec. 28, 2017  (JP) .............................. JP2017-253650

(51) Int. Cl.
*B01D 71/02*  (2006.01)
*B01D 67/00*  (2006.01)
*B01D 69/10*  (2006.01)
*C01B 3/50*   (2006.01)
*C01B 21/06*  (2006.01)

(52) U.S. Cl.
CPC ......... *B01D 71/02* (2013.01); *B01D 67/0072* (2013.01); *B01D 69/105* (2013.01);
(Continued)

(58) Field of Classification Search
None
See application file for complete search history.

(56) References Cited

U.S. PATENT DOCUMENTS

| 2007/0248874 A1* | 10/2007 | Aoyama | ............ | B01D 67/0072 |
| | | | | 429/411 |
| 2017/0001153 A1* | 1/2017 | Ichinose | ............ | B01D 67/0072 |

FOREIGN PATENT DOCUMENTS

| CN | 104805408 | 7/2015 |
| JP | 2000-129420 | 5/2000 |

(Continued)

OTHER PUBLICATIONS

Kura, Chiharu et al. "Hydrogen separation by nanocrystalline titanium nitride membranes with high hydride ion conductivity", Nature Energy, vol. 2, Oct. 2017, pp. 786-794. (Year: 2017).*

(Continued)

*Primary Examiner* — Jason M Greene
(74) *Attorney, Agent, or Firm* — Hamre, Schumann, Mueller & Larson, P.C.

(57) ABSTRACT

The present invention pertains to a polycrystalline membrane containing metal nitride particles represented by the general formula $MN_x$ (where M is a metal element in which the Fermi energy is in a position higher than −4.4 eV vs L.V. and x is the range over which a rock salt-type structure can be assumed), in which the crystallite size determined by transmission electron microscopy is 10 nm or less, at least some of the crystallites have rock salt-type structure, and the crystallites exhibit (111) orientation but substantially do not exhibit (100) orientation. The present invention also pertains to a method for manufacturing a polycrystalline membrane, comprising forming, by sputtering, a polycrystalline membrane on a substrate having a temperature of less than 200° C., the polycrystalline membrane being represented by the general formula $MN_x$ and being such that at least some (Continued)

crystallites have a rock salt structure and the crystallites exhibit (111) orientation but essentially do not exhibit (100) orientation. The present invention provides a hydrogen-permeable $TiN_x$ microparticle membrane exhibiting a higher mixed hydride ion ($H^-$)-electron conduction.

18 Claims, 6 Drawing Sheets

(52) U.S. Cl.
CPC .......... *C01B 3/503* (2013.01); *C01B 21/0615* (2013.01); *B01D 2325/02* (2013.01); *B01D 2325/04* (2013.01); *B01D 2325/20* (2013.01); *C01B 2203/0405* (2013.01)

(56) References Cited

FOREIGN PATENT DOCUMENTS

| | | |
|---|---|---|
| JP | 2005-279484 | 10/2005 |
| JP | 2016-181571 | 10/2016 |

OTHER PUBLICATIONS

International Preliminary Report on Patentability issued in International Application No. PCT/JP2018/047935, dated Apr. 28, 2020, 13 pages with translation.

International Search Report issued in International Application No. PCT/JP2018/047935, dated Mar. 26, 2019, 12 pages.

Kura, et al., "Particle size effect on hydride ion conductivity of TiNx nanocrystalline membranes", ECSJ Fall Meeting 2017, 2 pages—see the English translation of the IPRP for a concise explanation.

Kura, et al., "Hydrogen separation by nanocrystalline titanium nitride membranes with high hydride ion conductivity", Nature Energy, vol. 2, Oct. 2017, pp. 786-794.

Cornaglia, et al., "Recent advances in catalysts, palladium alloys and high temperature WGS membrane reactors A review", International Journal of Hydrogen Energy 40, 2015, pp. 3423-3437.

Al-Mufachi, et al., "Hydrogen selective membranes: A review of palladium-based dense metal membranes", Renewable and Sustainable Energy Reviews 47 (2015), pp. 540-551.

Rebollo, et al., "Exceptional hydrogen permeation of all-ceramic composite robust membranes based on BaCe0.65Zr0.20Y0.15O3-d and Y-or Gd-doped ceria" Energy Environ. Sci. 2015, 8, pp. 3675-3686.

Zhu, et al., "Evaluation of hydrogen permeation properties of NieBa(Zr0.7Pr0.1Y0.2)O3-d cermet membranes" International Journal of Hydrogen Energy 39, 2014, pp. 11683-11689.

Yamazaki, et al., "Proton trapping in yttrium-doped barium zirconate" Nature Materials, vol. 12. Jul. 2013, pp. 647-651.

Kim, et al., "Evaluations of hydrogen permeation on TiN-5 wt.%Ni membrane by spark plasma sintering", International Journal of Hydrogen Energy 35, 2010, pp. 12981-12985.

Nozaki, et al., "Improvement of high temperature stability of Pd coating on Ta by HfN intermediate layer" International Journal of Hydrogen Energy 35, 2010, pp. 12454-12460.

* cited by examiner

HYDROGEN SEPARATION MEMBRANE

TECHNICAL FIELD

The present invention relates to a metal nitride $MN_x$ membrane having hydrogen permeation properties. A membrane of the present invention can be utilized to separate hydrogen from a mixed gas containing hydrogen because it selectively permeates hydrogen.

CROSS-REFERENCE TO RELATED APPLICATIONS

This application claims priority to Japanese Patent Application No. 2017-253650, filed Dec. 28, 2017, the entire disclosure of which is specifically incorporated herein by reference.

BACKGROUND OF THE INVENTION

In a sustainable society, the use of rare elements should be minimized by replacing them with more abundant ones. For example, palladium (Pd) is a kind of noble metal, but is widely used as a hydrogen separation membrane for purifying pure hydrogen gas from gas mixtures produced by electrolysis of water, methane steam reforming, partial oxidation of natural gas, and the like [Non-Patent Document 1, 2] However, as fuel cells become widespread, the demand for pure hydrogen as a clean and efficient energy source has increased dramatically, and thus the expectations for a non-Pd alternative hydrogen membrane have increased. Until now, hydrogen permeation membranes have mainly been developed among from the group of hydrogen absorbing alloys, but such materials have an essential problem of hydrogen embrittlement. Hydrogen solubility into metallic matrices promotes its tissue deformation. Thus, the more hydrogen solubility a metal, that is, the more hydrogen permeation a metal, the more serious the hydrogen embrittlement. Under this background, there is a need for a guide for designing completely new hydrogen membranes that do not depend on the degree of hydrogen solubility to the metal matrices.

Mixed proton-electron conductors (MPECs) are expected as new principle of hydrogen separation membrane characterized by bipolar diffusions of $H^+$ and $e^-$ [Non-Patent Document 3, 4]. Perovskite-type $BaM_{1-x}M'_xO_{3-\delta}$ (M=Ce, Zr, M'=Y, Yb, etc.) proton-conductive ceramics have been actively studied as the MPECs. However, their proton carriers tend to make strong bonds with lattice oxygens (50-60 kJ $mol^{-1}$) [Non-Patent Document 5]. Therefore, a high hydrogen transport characteristic cannot be obtained at a temperature of 600° C. or less. However, according to the U.S. Department of Energy (DOE) roadmap (2007 edition), materials that produce $1 \times 10$ mol $cm^{-2}$ of hydrogen flux under the conditions of temperature: 400° C. or less and pressure differential: $1.3 \times 10^5$ Pa are required in 2015.

The best hydrogen permeation capability at present is represented by $Pd_{0.8}Ag_{0.2}$ (Non-Patent Document 1, 2). However, temperatures of 500° C. or more are required, if hydrogen permeation is performed using a hydrogen membrane having a membrane thickness of 5 micrometers, which is the technically limited thickness where the membrane will collapse due to hydrogen embrittlement if the thickness is made thinner than it.

It has also been reported that TiN thin films exhibit hydrogen permeation (Non-Patent Document 6, 7). A patent has also been filed (Patent Document 1). Although a hydrogen permeation method appears problematic, Non-Patent Document 6 also reports that the TiN thin films are comparable to Pd membrane.

In contrast, the present inventors found that $TiN_x$ (x=0.7, 0.9, or 1.0) particulate membrane, a type of metal nitride, exhibited mixed hydride ion ($H^-$)-electron conductivity (Non-Patent Document 8). This material was found to have very low (about 12 kJ mol) activation energy for hydride ion diffusion in a membrane, and thus to have an order of magnitude higher hydrogen permeation capacity at room temperature than a Pd membrane of the same membrane thickness (Non-Patent Document 8).

Patent Document 1: JP-A-2005-279484
Non-Patent Document 1: Cornaglia, L., Munera, J. & Lombardo E. Int. J. Hydrogen Energy. 40, 3423-3437 (2015).
Non-Patent Document 2: Al-Mufachi, N. A., Rees, N. V. & Wilkens, R. S. Renew. Sust. Energ. Rev. 47, 540-551 (2015).
Non-Patent Document 3: Rebollo, E. et al. Energy Environ. Sci. 8, 3675-3686 (2015).
Non-Patent Document 4: Zhu, Z. et al. Int. J. Hydrogen Energy. 39, 11683-11689 (2014).
Non-Patent Document 5: Yamazaki. Y. et al. Proton trapping in yttrium-doped barium zirconate. Nature. Mater. 12, 647-651 (2013).
Non-Patent Document 6: Kim, K.-I. et al. Int J. Hydrogen Energy, 35, 12981 (2010).
Non-Patent Document 7: Nozaki, T. et al. Int J. Hydrogen Energy, 35, 12454 (2010).
Non-Patent Document 8: Nature Energy, Vol. 2, October 2017, 786-794 The entire descriptions of Patent Document 1 and Non-Patent Documents 1-8 is incorporated herein by reference in particular.

SUMMARY OF THE INVENTION

However, high hydrogen permeation capability is required at practical levels. There is a need to develop a hydrogen permeation membrane that exhibits mixed hydride ion ($H^-$)-electron conductivity even higher than the $TiN_x$ (x=0.7, 0.9, or 1.0) particulate membrane described in Non-Patent Document 8.

The present invention aims to provide a hydrogen permeation membrane which exhibits even higher mixed hydride ion ($H^-$)-electron conductivity than $TiN_x$ particle membrane described in Non-Patent Document 8.

Means for Solving the Problems

In Non-Patent Document 8, a $TiN_x$ particulate membrane is obtained by adjusting x to 0.7, 0.9, or 1.0 (strictly, 0.74, 0.95, or 1.02) by setting the sputtering substrate temperature to 500° C. or 200° C. and changing the nitrogen concentration ($N_2$ concentration in Ar) in the process gas. In Non-Patent Document 8, referring to FIG. 2a and Fig. S1, it is inferred that for $TiN_x$ particulate membrane (x=0.7, 0.9), it is more favorable for hydrogen permeation to be (111) orientation than (100) orientation of rock salt structure. However, Non-Patent Document 8 does not suggest a guideline for influence of dominancy of (111) orientation to improvement of hydrogen permeation or a method to make (111) orientation more dominant in a $TiN_x$ particulate membrane.

The inventors of the present invention have investigated variously membranes having a hydrogen permeation better than that of $TiN_x$ particulate membrane of Non-Patent Document 8. As a result, it was found that $TiN_x$ particulate membrane produced by a special manufacturing method and having a crystallite size of 10 μm or less and a crystallite of (111) orientation, which is not known in the art, have a remarkably superior hydrogen permeation property to $TiN_x$ particulates membrane of Non-Patent Document 8, thereby completing the present invention.

When a $TiN_x$ particle membrane was prepared by the sputtering method described in Non-Patent Document 8, the substrate temperature was set at 200° C. Setting the substrate temperature to a lower temperature was difficult with a conventional sputtering device. The present inventors have greatly improved the sputtering device so that the substrate temperature can be controlled around room temperature. Then, a $TiN_x$ particulate membrane having the above-mentioned structure and having a remarkably improved hydrogen permeation property was obtained.

The present invention is shown below:

[1] A polycrystalline substance membrane comprising particles of a metal nitride represented by the general formula $MN_x$, wherein M is a metal element of which Fermi energy is higher than −4.4 eV vs L.V., and x is within the range where rock salt structure is adopted, wherein crystallite size determined by transmission electron microscopy observation is 10 nm or less, at least a part of the crystallite has rock salt structure, the crystallite exhibits (111) orientation but substantially no (100) orientation.

[2] The polycrystalline substance membrane according to [1], wherein M is at least one metal selected from the group consisting of Ti, Hf, Ta, Mo, Cr, V and Zr.

[3] The polycrystalline substance membrane according to [1] or [2], wherein M is Ti and x is 0.5 or more and 1.0 or less.

[4] The polycrystalline substance membrane according to any one of [1] to [3], wherein the membrane comprises hydride ion ($H^-$).

[5] The polycrystalline substance membrane according to any one of [1] to [4], wherein the crystallite size is 8 nm or less.

[6] A membrane for hydrogen separation consisting of the polycrystalline substance membrane according to any one of [1] to [5] or comprising the polycrystalline substance membrane according to any one of [1] to [5].

[7] A method for production of the membrane according to any one of [1] to [6], comprising forming by sputtering onto a substrate at a temperature of less than 200° C., a polycrystalline substance membrane comprising metal nitride particles represented by the general formula $MN_x$, wherein M is a metal element of which Fermi energy is higher than −4.4 eV vs V.L. and x is within the range where rock salt structure is adopted, at least a portion of crystallite has rock salt structure, and the crystallite exhibits (111) orientation but substantially no (100) orientation.

[8] The method for production according to claim [7], wherein the substrate temperature is 50° C. or less.

[9] The method for production according to claim [7], wherein the substrate temperature is 30° C. or less.

[10] The method for production according to any one of [7] to [9], wherein the substrate is porous substance.

Effect of the Invention

The present invention provides a hydrogen permeation membrane that exhibits much higher mixed hydride ion ($H^-$)-electron conductivity than $TiN_x$ particulate membrane described in Non-Patent Document 8. A more practical membrane for hydrogen separation can be provided.

EMBODIMENTS OF THE INVENTION

The hydrogen permeation membrane of the present invention is a polycrystalline substance membrane comprising metal nitride particles represented by the general formula $MN_x$, wherein M is a metal element of which Fermi energy is higher than −4.4 eV vs L.V., and x is within the range where rock salt structure is adopted.

Crystallite size of metal nitride configuring this membrane are 10 nm or less, at least some or all of crystallite has rock salt structure, and the crystallite exhibits (111) orientation but substantially no (100) orientation. In particular, since the crystallite having rock salt structure exhibits (111) orientation but substantially no (100) orientation, it is possible to exhibit a higher mixed hydride ion ($H^-$)-electron conductivity hydrogen permeation property than the hydrogen permeation membrane described in Non-Patent Document 8.

Metal nitride MN is a metal nitride where Fermi energy is higher than −4.4 eV vs V.L. (Vacuum Level), specifically, for example, is a nitride containing at least one metal selected from the group consisting of Ti, Hf, Ta, Mo, Cr, V and Zr. Fermi energies of metal element nitrides are as follows.

TiN: −4.1 eV,
HfN: −4.3 eV,
TaN: −4.4 eV,
MoN: −4.2 eV,
CrN: −4.0 eV,
VN: −3.9 eV,
ZrN: −4.1 eV x of metal nitride $MN_x$ is appropriately determined from the range in which the metal nitride adopts rock salt structure.

M of the metal nitride is preferably Ti and metal nitride $MN_x$ is indicated by $TiN_x$. In this case, x which is the range in which rock salt structure is adopted is 0.5 or more and 1.2 or less. From the viewpoint of that the crystallite exhibits (111) orientation but does not substantially exhibit (100) orientation, x is 0.5 or more and less than 1.0

When M of metal nitride is Hf, Ta, Mo, Cr, V or Zr, the range of x where the metal nitride adopts rock salt structure is theoretically 0.5 or more, 1.2 or less. However, similar to in case of $TiN_x$, x is set within the above range and within the range that $MN_x$ crystallite indicates (111) orientation but does not substantially indicate (100) orientation.

The polycrystalline substance membrane of the present invention may be a membrane comprising metal nitride particles of the general formula $MN_x$ or consisting of metal nitride particles of the general formula $MN_x$. The following explanation assumes that $MN_x$ is $TiN_x$.

The ratio x of N (nitrogen) to Ti (titanium) of $TiN_x$ is 0.5 or more and less than 1.0. The ratio x is practically in the range of 0.5 or more and less than 1.0, as described above, since it is in the range where crystallite has rock salt structure and exhibits (111) orientation but substantially does not exhibit (100) orientation. Furthermore, based on the data of the Examples, the lower limit of x is preferably 0.6, 0.65, or 0.7. The upper limit is preferably 0.95, 0.8, or 0.75. The smaller the ratio x, the greater Ti/N molar ratio of crystallite surface. Therefore, although hydrogen permeation becomes large, if it becomes too small, it tends to be difficult to form rock salt structure. On the other hand, as the ratio x approaches 1, Ti/N molar ratio of crystallite surface decreases. Therefore, hydrogen permeation property tends to decrease.

Figure 5:
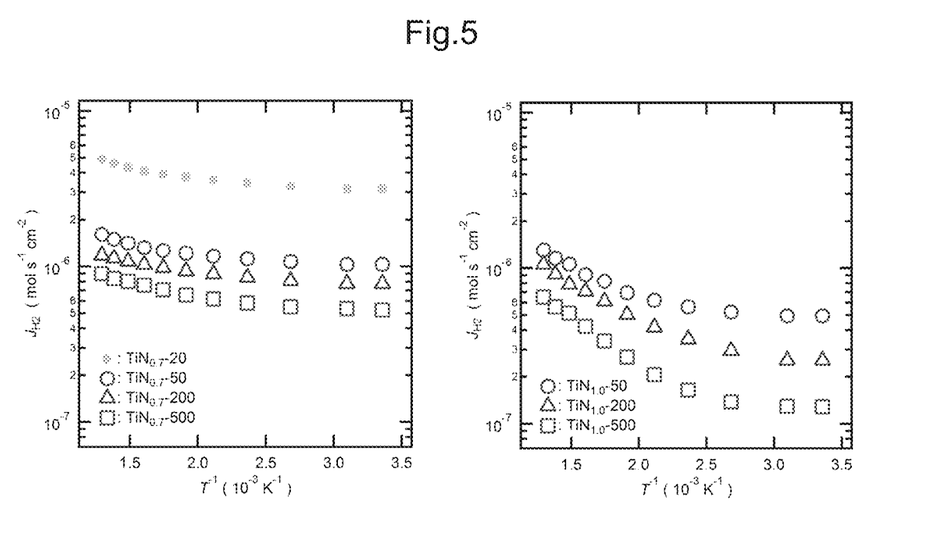
FIG. 5 shows an Arrhenius plot of hydrogen permeation flux for the respective thin films.

Crystallite size that configures the polycrystalline substance membrane of the present invention is determined by transmission electron microscopy (TEM) observation, and more specifically by high resolution transmission electron microscopy observation. Here, the high resolution is a spatial resolution of 0.2 nm or less. Crystallite size is 10 nm or less, preferably 9 nm or less, more preferably 8 nm or less, still more preferably 7 nm or less, still more preferably 6 nm or less, and still more preferably 5 nm or less. The smaller crystallite size, the more prone hydrogen permeation property. Referring particularly to FIG. 5 of the Examples and the results in Table 1, crystallite sizes below 8 nm and near 5 nm tend to exhibit suddenly higher hydrogen permeation. From the standpoint of obtaining higher hydrogen permeation, there is no lower limit to crystallite size. In terms of realistic manufacturability, the lower limit is 0.5 nm or 1 nm. However, the present invention is not intended to be limited to this value.

At least a portion of crystallite configuring polycrystalline substance membrane of the present invention has rock salt structure and exhibits (111) orientation but substantially no (100) orientation. Orientation of crystallite $TiN_x$ with rock salt structure includes (111) and (100) plane orientations. A $TiN_x$ crystallite with rock salt structure exhibiting (111) orientation and substantially not exhibiting (100) orientation provides significantly higher hydrogen permeation due to mixed hydride ion ($H^-$)-electronic conductivity.

The polycrystalline substance membrane of the present invention may contain oxygen as an impurity. However, the inclusion of oxygen is not intentional, and it is a contaminant by mixing from the atmosphere in the manufacturing process. From the viewpoint of hydrogen permeation by mixed hydride ion ($H^-$)-electron conductivity, the smaller the oxygen content as an impurity, the more preferable the oxygen content is. For example, the atomic ratio O/Ti is 0.1 or less, preferably 0.05 or less. In the $TiN_x$ membrane shown in the Example, it was <0.04. Since the smaller oxygen content as an impurity is preferable, it is preferable that the content is not more than detection limit of the analytical device used for measuring the oxygen content.

When contacted with hydrogen, the polycrystalline substance membrane of the present invention produces hydride ion ($H^-$), which forms a polycrystalline substance membrane containing hydride ion. Without being bound by theory, it is presumed that hydride ion is mainly present on the crystallite surface of the polycrystalline substance membrane. The presence of hydride ion may be verified, for example, by measurement by $^1H$ nuclear magnetic resonance (NMR) spectroscopy.

The present invention includes a membrane for hydrogen separation consisting of polycrystalline substance of the present invention, and a membrane for hydrogen separation containing polycrystalline substance membrane of the present invention as a component. The membrane for hydrogen separation, which contains the polycrystalline substance membrane of the present invention as a component, may be, for example, a polycrystalline substance membrane on a porous substrate. Membrane thickness of polycrystalline substance used in the membrane for hydrogen separation is not particularly limited, and may be, for example, in the range of 100 nm to 5000 nm, and may be in the range of 200 nm to 1000 nm.

The polycrystalline substance membrane of the present invention may be produced, for example, by the following process.

A method for production of the membrane comprises forming by sputtering onto a substrate at a temperature of less than 200° C., a polycrystalline substance membrane comprising metal nitride particles represented by the general formula $MN_x$, wherein MN is a metal nitride of which Fermi energy is higher than −4.4 eV vs V.L. and x is within the range where rock salt structure is adopted, at least a portion of crystallite has rock salt structure, and the crystallite exhibits (111) orientation but substantially no (100) orientation.

The polycrystalline substance membrane of the present invention is obtained by forming a $MN_x$ polycrystalline substance membrane on a substrate by sputtering. The temperature of the substrate at the time of sputtering is less than 200° C. This permits to form a $MN_x$ polycrystalline substance membrane in which at least a portion of crystallite has rock salt structure and crystallite exhibits (111) orientation but substantially no (100) orientation. The lower the temperature of the substrate during sputtering, tends to obtain a polycrystalline substance containing a large amount of crystallite having rock salt structure and (111) orientation. Therefore, the temperature of the substrate at the time of sputtering is preferably 100° C. or less, more preferably 50° C. or less, still more preferably 30° C. or less, and even more preferably 20° C. or less. The temperature may be 10° C. or less, or 0° C. or less, by devising device mechanisms. There is no lower limit to the temperature of the substrate at the time of sputtering, but in reality, the temperature is, for example, −20° C. or more, −10° C. or more, or 0° C. or more.

The substrate to be used for sputtering is preferably a porous material because the substrate can be used as it is as a substrate of membrane for hydrogen separation. The porous material is not limited, but may be appropriately selected from porous alumina, nickel-zirconia cermet, zeolite, organic materials, polymer materials, and the like. Since the substrate temperature of the sputtering is low, even a material having low heat resistance can be used as a substrate.

Metal targets used for sputtering, sputtering devices, sputtering conditions (other than the temperature of the substrate at the time of sputtering) is not particularly limited, known materials, devices and conditions can be appropriately utilized. As the process gas, for example, an Ar/$N_2$ mixed gas may be used. The mixing ratio of Ar and $N_2$ may be appropriately selected considering the ratio of metals and nitrogen in a metal nitride. Crystallite size can be controlled by adjusting substrate temperature. Especially when performing sputtering at room temperature, the temperature of the substrate is increased to near 100° C. by the collision of the sputtered particles. Therefore, in order to suppress the particle growth (increase in crystallite size), it is desirable to perform sputter vapor deposition while constantly cooling the substrate. In the Embodiments described below, a water-cooling mechanism is mounted on the rear surface of the stage for mounting the substrate in the chamber, thereby devising to maintain the substrate temperature during sputtering at 20-50° C.

EXAMPLES

The present invention is further specifically described based on Examples. Examples exemplify the present invention and it is not intended that the present invention is limited by Examples.

Example 1

(1) Experimental Methods

Figure 1:
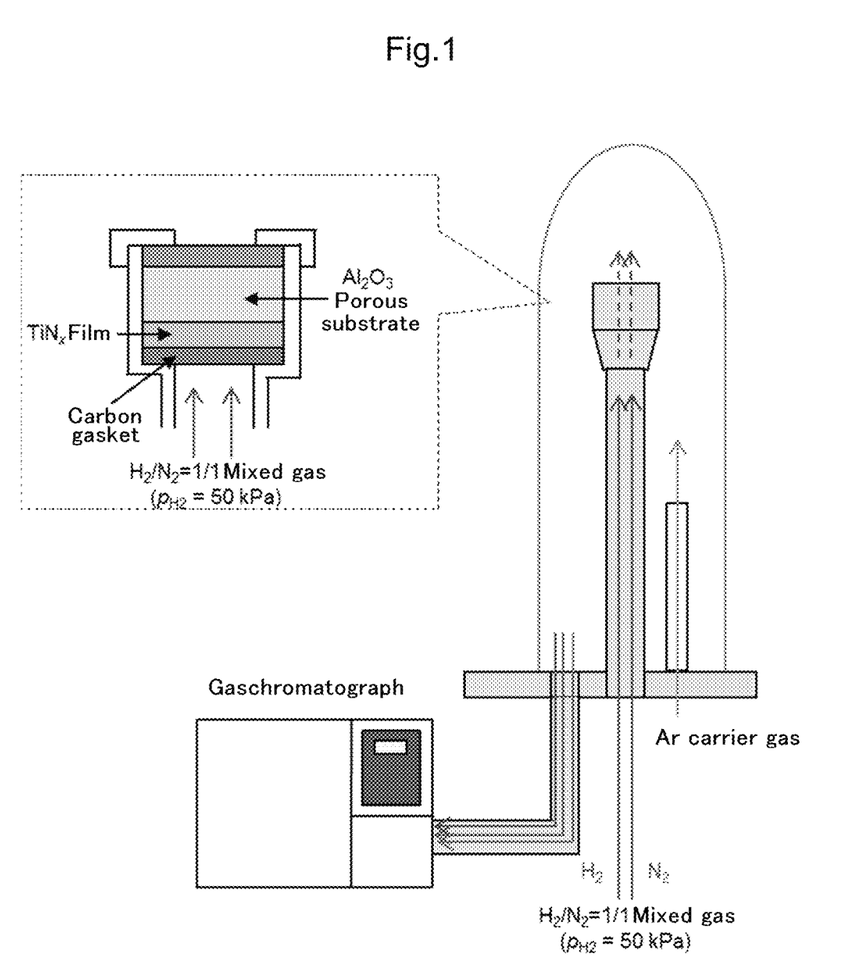
FIG. 1 shows a schematic diagram of an in-house chamber system with a gas chromatograph.

A TiN$_x$ membrane (x=0.7, 1.0) with various crystallite sizes was fabricated by reactive RF-sputtering by using an ultra-high-vacuum chamber system (ULVAC S-3000, base-pressure<2×10$^{-5}$ Pa). Sputtered membrane formation was performed using a 2-inch-diameter Ti (99.99% pure) disc as a target. The chamber pressure was 0.9 Pa, and the substrate temperature was 500° C., 200° C., 50° C., or 20° C. The sputtering power was 195 W, and an Ar/$N_2$ mixed gas was flowed at 20 sccm as a processing gas. When the substrate temperatures were 50° C. and 20° C., a device for cooling the substrate was used. The mix ratio of Ar/$N_2$ mixed gas used is an optimum value for obtaining the composition membrane of TiN$_{0.7}$ and TiN$_{1.0}$, and it depends on the substrate temperature. The optimum $N_2$ concentrations for obtaining TiN$_{0.7}$ and TiN$_{1.0}$ membrane at the respective substrate temperatures are summarized in Table 1. For hydrogen permeation testing, a TiN membrane was formed on a porous alumina substrate (40% porosity) with surface-modification of mesoporous γ-Al$_2$O$_3$ layer [Reference document 1]. The degree of hydrogen permeation of TiN membrane was measured using an in-house chamber system equipped with a gas chromatograph (Variant Micro GC-4000) (FIG. 1). An alumina-supported TiN$_x$ sample was secured to a sample holder using a carbon sheet gasket and placed in an electric furnace. Pure Ar gas was supplied to the porous support side at 25 sccm, and H$_2$/N$_2$ mixed gas (1:1) was supplied to membrane front side at 100 sccm. The gas discharged from the porous support was analyzed by GC to determine the hydrogen flux (J$_{H2}$) and the nitrogen flux (J$_{N2}$). Hydrogen permeation rate and hydrogen-selectivity of membrane were evaluated.

Hydrogen solubility to membrane was determined by Quartz Crystal Microbalance. An AT-cut quartz crystal resonator of 5 MHz resonant frequency with gold electrode vaporized on both sides was used. A TiN$_x$ membrane was sputter-vapor deposited on the gold electrode on one side of the quartz crystal resonator under the conditions of Table 1, and it was attached to an airtight cell with a built-in oscillator. Initially, dry Ar gas was flowed into the cell at 20 SCCM, and it was confirmed that the oscillation of the transmitter was stabilized in the vicinity of resonant vibration frequency. After that, switching to hydrogen gas, and the change of frequency was examined. According to the Saurbrey equation, when hydrogen dissolution occurs in the membrane vapor deposited on the quartz crystal resonator, vibration frequency of the vibrator changes according to the following equation (1) due to the weight of the dissolved hydrogen.

$$\Delta f_{ads} = \frac{-2 f_0^2 \Delta m}{A \sqrt{\rho_q \mu_q}} \quad (1)$$

In the equation, $f_0$ is the fundamental frequency (5 MHz), A is gold electrode area (1.11 is cm$^2$), $\mu_q$ is the shearing stress of quartz (2.95×10$^{11}$ in g cm$^{-1}$), $\rho_q$ is the density of quartz (2.65 g cm$^{-3}$), and $\Delta_m$ is the weight of the hydrogen introduced into TiN$_x$, and the $\Delta f_{ads}$ is the corresponding frequency change.

(2) Results

Ar/$N_2$ mixing ratios in the reactive sputtering process gases and the temperatures of the substrates were adjusted. By doing so, N-deleted TiN$_{0.7}$ and stoichiometric TiN$_{1.0}$ thin film of various crystallite sizes could be produced. The compositions of the thin films were confirmed by wavelength dispersive X-ray absorptiometry. In addition, it was confirmed that the oxygen impurity content was kept relatively low at O/Ti<0.04 in all thin film compositions. The vapor deposition conditions ($N_2$ concentrations and substrate temperatures) of both thin films are shown in Table 1. At 20° C., no TiN$_{1.0}$ was obtained even if the process gas was 100%-$N_2$, and only N-deleted TiN$_{0.7}$ was generated. Hereinafter, the thin films prepared at the vapor deposition temperatures of 20, 50, 200 and 500° C. are referred to as TiN$_x$-20, TiN$_x$-50, TiN$_x$-200, and TiN$_x$-500 (x=0.7, 1.0), respectively.

Figure 2:
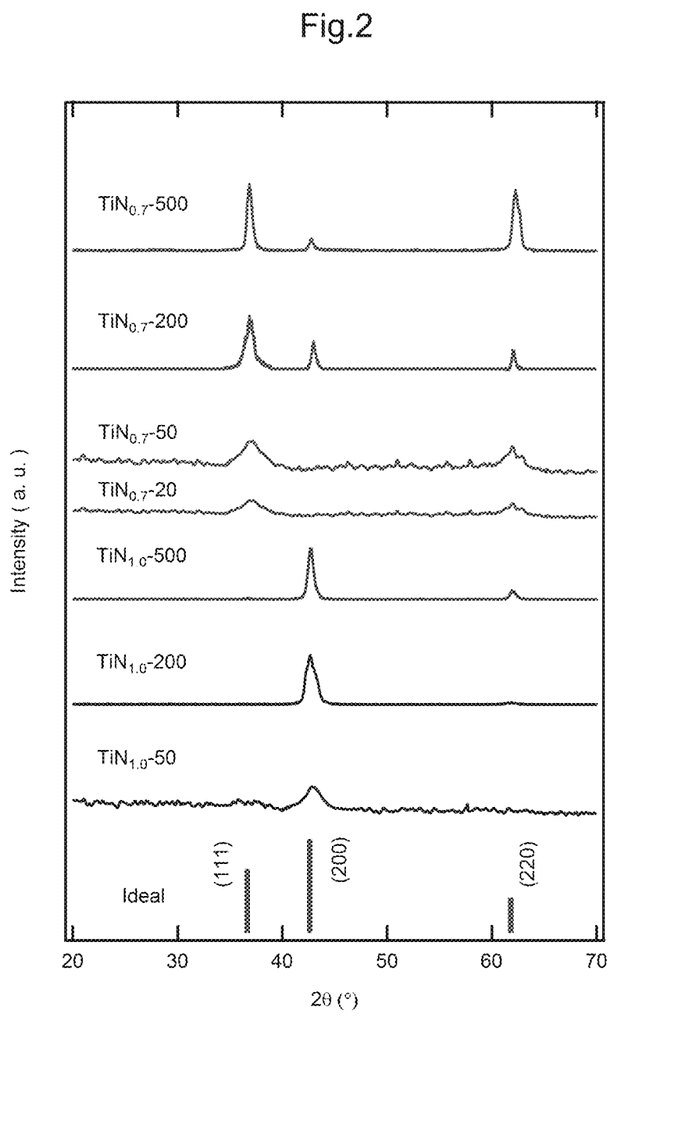
FIG. 2 shows XRD-patterns of $TiN_x$ thin films that have been composited on a γ-$Al_2O_3$ layer (100 nm) coated Si substrate at various temperatures.

FIG. 2 shows the XRD-patterns of TiN$_x$ thin films that have been formed on a Si substrate with a coating of γ-Al$_2$O$_3$ layer (100 nm). It was compared with the relative intensity ratio (200)/(111)=100/60) of the (200) and (111) peaks of the theoretical diffraction pattern of TiN. Consequently, it can be seen that the N-deleted TiN$_{0.7}$ has (111) orientation because the relative strength of a (111) peak is large, and the stoichiometric TiN$_{1.0}$ have (100) orientation from a similar comparison. In both cases, the half-value widths of the peaks increase and crystallite sizes decrease as the vapor deposition temperatures decrease. Crystallite sizes determined by the Scherror equation are shown in Table 1.

Figure 3:
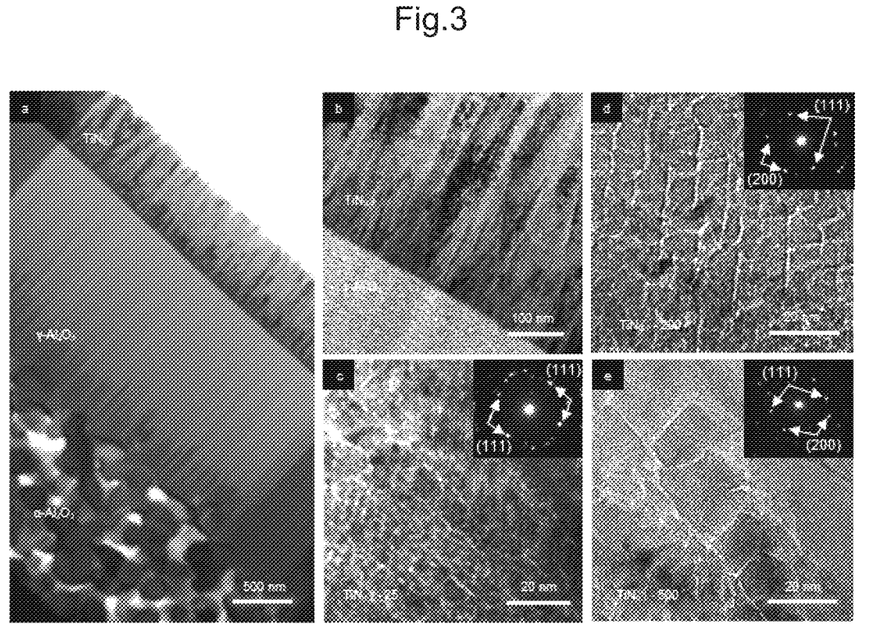
FIG. 3 shows cross-sectional electron microscopy photographs of a $TiN_x$ membrane made on a porous alumina-substrate.

FIG. 3 shows a cross-sectional transmission electron microscopy (TEM) photograph of a TiN$_x$ membrane fabricated on a porous alumina substrate. FIG. 3a is a cross-sectional TEM image of a composite film including a TiN$_{0.7}$ (top layer 600 nm), a mesoporous γ-Al$_2$O$_3$ layer (middle layer 1 μm) and a porous a Al$_2$O$_3$ substrate (support). It can be seen that the TiN$_{0.7}$ membrane in membrane thickness of 600 nm has been uniformly formed on the porous substrate. FIG. 3b is a cross-sectional TEM-image showing the columnar morphology of a TiN$_{0.7}$ membrane. It can be seen that the TiN$_{0.7}$ has a column-like structure of several tens of nanometers in diameter. In addition, one of the columns was observed by high-resolution transmission electron microscopy (TEM). It can be seen that crystallite of $TiN_{0.7}$-20, $TiN_{0.7}$-200 and $TiN_{0.7}$-500 consist of about 5 nm, 13 nm and 20 nm, respectively (FIG. 3c-e). These were in good agreement with crystallite sizes determined by XRD. Therefore, the $TiN_x$ membranes prepared by the sputtering method can be said to be nanocrystalline membranes. Comparing $TiN_{0.7}$ and $TiN_{1.0}$ produced at the same temperature, it can be seen that crystallite sizes are almost identical.

Figure 4:
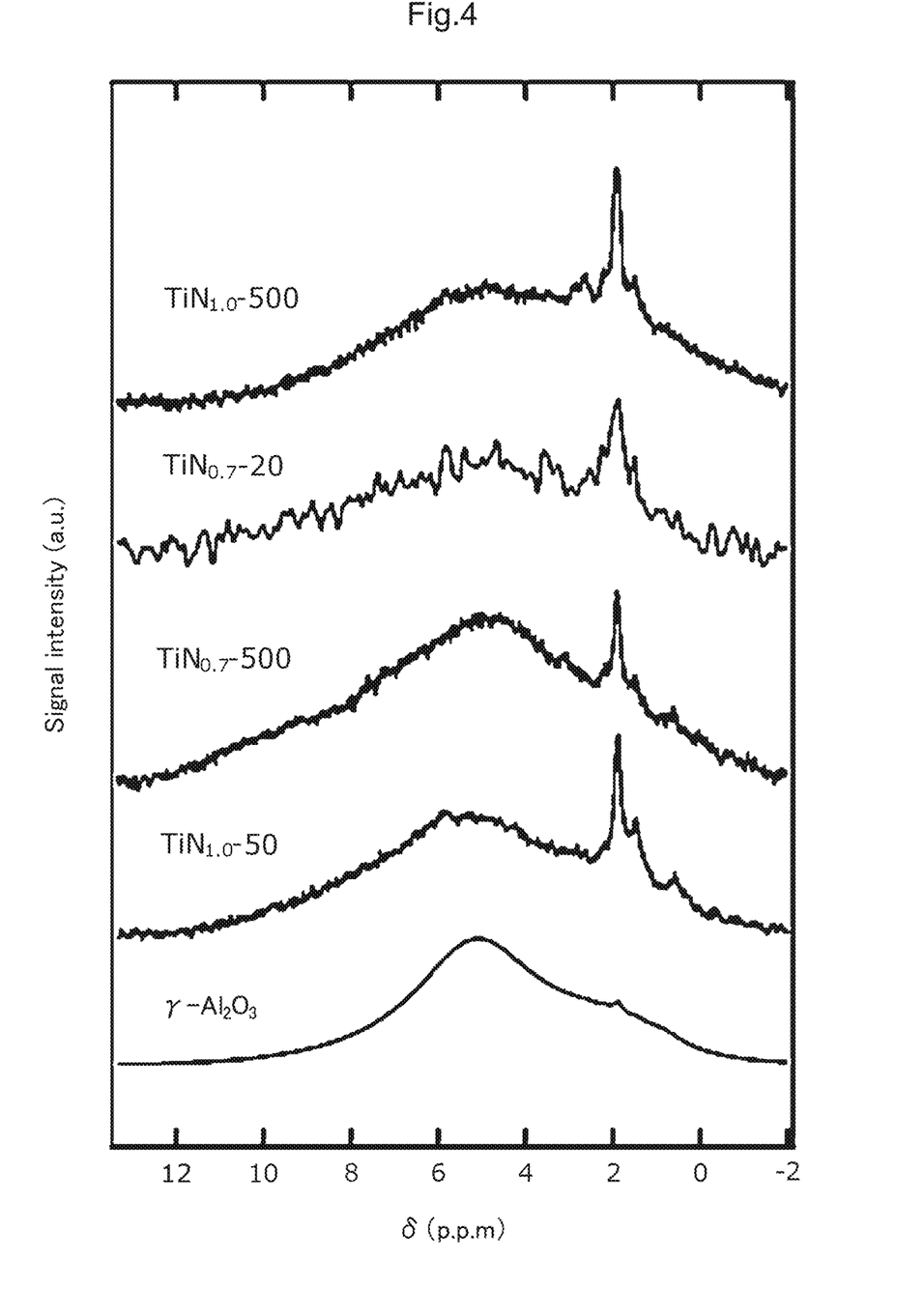
FIG. 4 shows $^1H$ nuclear magnetic resonance (NMR) spectroscopy spectrum of respective thin film samples. The spectrum of the γ-$Al_2O_3$ used as the sacrifice layer is also shown.

$TiN_x$-20, $TiN_x$-50, $TiN_x$-200, and $TiN_x$-500 membranes were heated at 500° C. for 1 h in 50%-$H_2$/Ar atmosphere. Results of $TiN_{0.7}$ and $TiN_{1.0}$ of these samples before and after hydrogen treatment by $^1H$ nuclear magnetic resonances (NMR) spectrum are shown in FIG. 4. Each membrane was initially vapor deposited on a Si-Wafer modified with a γ $Al_2O_3$ sacrifice layer. The substrate was then scraped off with a spatula to obtain a powder, which was measured. All $TiN_x$ samples had sharp peaks at δ=1.98 p.p.m. Moreover, this peak becomes more pronounced upon hydrogen treating at 500° C. The chemical shift is very close to a minor peak (1.93 p.p.m.) which is considered to be derived from $H^-$ ions of titanium hydride $TiH_2$. However, it is much smaller than proton groups such as Ti—NH (3.9 p.p.m.) or Ti—$NH_2$ (13.5 p.p.m.). The hydrogen treatment was carried out by heating at 500° C. for 2 h in 50% $H_2$/Ar. FIG. 4 also includes the spectrum of the γ-$Al_2O_3$ used as the sacrifice layer.

In recent years, Hayashi et al. have reported that there is a correlation between $^1H$-chemical shift ($H^-$) of a metal hydride $MH_y$ and M-H bond length ($d_{M-H}$) represented by the following equation (2) [Reference document 2].

$$\delta_{iso}(H^-)(\text{p.p.m.})=0.070 d_{M-H}(\text{pm})-11.5(\pm 2) \quad (2)$$

Substituting Ti—H bond length (188 μm) into equation (2) yields $\delta_{iso}$ ($H^-$)=1.66 p.p.m. This value agrees well with the observed peak (1.93 ppm). From the above, it was proven that the mobile hydrogen species in $TiN_x$ was hydride ion ($H^-$) bonded to Ti cation.

Previous studies have shown that such a hydride ion exists as a Ti—H hydride group in conjunction with a $Ti^{3+}$ cation on the surface of $TiN_x$ crystallite. Therefore, it is confirmed that hydrogen permeation of $TiN_x$ membrane generates by diffusion of the hydride ion through the boundaries of crystallite, i.e. the grain boundaries [Reference document 3].

FIG. 5 shows the Arrhenius plots of hydrogen permeation flux ($J_{H2}$) of each thin film. For any crystallite sizes, (111) orientation $TiN_{0.7}$ increased slightly with increasing temperatures. On the other hand, (100) orientation $TiN_{1.0}$ significantly increased with temperature. This indicates that activation energy associated with hydrogen-diffusion in the former membrane is much lower than the latter. In fact, activation energy determined from the incline in the temperature range above 200° C. was 5.5-6 kJ $mol^{-1}$ for all $TiN_{0.7}$ and 11-12 kJ $mol^{-1}$ for the (100) orientation $TiN_{1.0}$.

(111) Orientation $TiN_{0.7}$ and (100) orientation $TiN_{1.0}$ were compared. For the same substrate temperature, the (111) orientation $TiN_{0.7}$ showed higher flux in whole temperature range than the (100) orientation $TiN_{1.0}$.

In both $TiN_{0.7}$ and $TiN_{1.0}$, it can be seen that with decreasing crystallite size, the flux is equally and significantly increased at all temperatures. In particular, when changing from $TiN_{0.7}$-50 to $TiN_{0.7}$-20, it can be seen that the hydrogen flux increased drastically and it was about three times as large. This is because since the diffusion path and the adsorption amount both increase in proportion to the reciprocal of the particle size by the reduction of the particle diameter, the transmission amount is proportional to the square of the reciprocal of the particle diameter.

In the measurement of FIG. 5, the partial pressure of hydrogen (P1) on the inlet side of FIG. 1 is 50 kPa, and the partial pressure of hydrogen on the outlet side (P2) is about 10 kPa. The pressure difference between the two is about 40 kPa. In terms of the DOE Standard (pressure differential of 130 kPa, outlet pressure of 20 kPa), the rate of hydrogen diffusion in solid is proportional to In (P1/P2). Hence, it is calculated to produce approximately $3\times10^{-5}$ $cm^{-2}$ $s^{-1}$ of hydrogen flux at 400° C. This is about 30% of the U.S. DOE Standard. It is equivalent to the value ($2.2\times10^{-5}$ of mol $cm^{-2}$ $s^{-1}$) at 500° C. of hydrogen permeation membrane of $Pd_{0.8}Ag_{0.2}$ with 5-μm membrane thick currently in practical use [Reference document 4].

Figure 6:
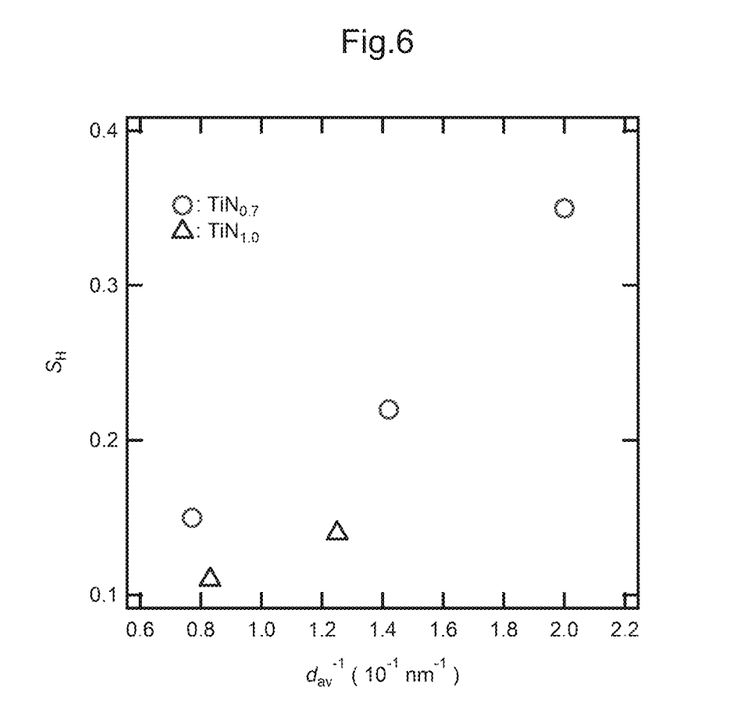
FIG. 6 is a diagram plotting hydrogen solubility in $TiN_x$ thin films against the reciprocal of crystallite size, as measured by the crystal resonator microgravimetry. Hydrogen solubility (SH=H/Ti) in (111) orientation $TiN_{0.7}$ and (100) orientation $TiN_{1.0}$ having the respective crystallite size (day) are indicated.

FIG. 6 is a diagram of hydrogen solubility (SH=H/Ti) in a $TiN_x$ thin film, measured by the crystal resonator microgravimetry, plotting against the reciprocal of crystallite size. In both $TiN_{0.7}$ and $TiN_{1.0}$, hydrogen solubility is increasing proportionally to the reciprocal of crystallite size (that is, the reduction in size). Further, it can be seen that when compared with the same particle size, a $TiN_{0.7}$ with (111) orientation shows a larger hydrogen solubility than $TiN_{1.0}$ of (100) orientation and that the rate of increase in solubility with decreasing crystallite sizes is large.

From the above, it has been shown that a hydrogen membrane which produces extremely high hydrogen flux can be provided by producing a thin film of (111) orientation $TiN_x$ membrane having crystallite sizes of several nanometers or less. In particular, when the membrane is made of (111) orientation crystallites having a size of several nanometers, very high hydrogen flux can be obtained, and it is expected that a membrane which satisfies the DOE value can be obtained even at room temperature.

Table 1 below shows the nitrogen concentrations in the process gases for sputter vapor deposition of $TiN_{0.7}$ and $TiN_{1.0}$ membranes at the respective vapor deposition temperatures, as well as orientation and crystallite sizes (day) determined by XRD measurement of the thin films produced.

TABLE 1

| Sample | Substrate temperature/° C. | $N_2$ concentration/% | $d_{av}$/nm | Crystallite Orientation |
|---|---|---|---|---|
| $TiN_{0.7}$-500 | 500 | 2.5 | 23 | 111 |
| $TiN_{0.7}$-200 | 200 | 4 | 13 | 111 |
| $TiN_{0.7}$-50 | 50 | 10 | 8 | 111 |
| $TiN_{0.7}$-20 | 20 | 60 | 5 | 111 |
| $TiN_{1.0}$-500 | 500 | 100 | 22 | 100 |
| $TiN_{1.0}$-200 | 200 | 100 | 12 | 100 |
| $TiN_{1.0}$-50 | 25 | 100 | 8 | 100 |

REFERENCE DOCUMENTS

[1] de Vos, R. M. & Verweij, H. Science. 279, 1710-1711 (1998).
[2] Hayashi, K, Sushko, P. V., Hashimoto, Y., Shluger, A. L. & Hosono, H. Nature Commun. 5, 35151-8 (2014).
[3] Kura, C., Kunisada, Y., Tsuji, E., Zhu, C., Habazaki, H., Nagata, S., Muller, M. P., De Souza, R. A. & Aoki, Y. Nature Energy 2, 786-794 (2018).
[4] Holleck, G. L. J. Phys. Chem. 74, 503-511 (1970).

Example 2

Figure 7:
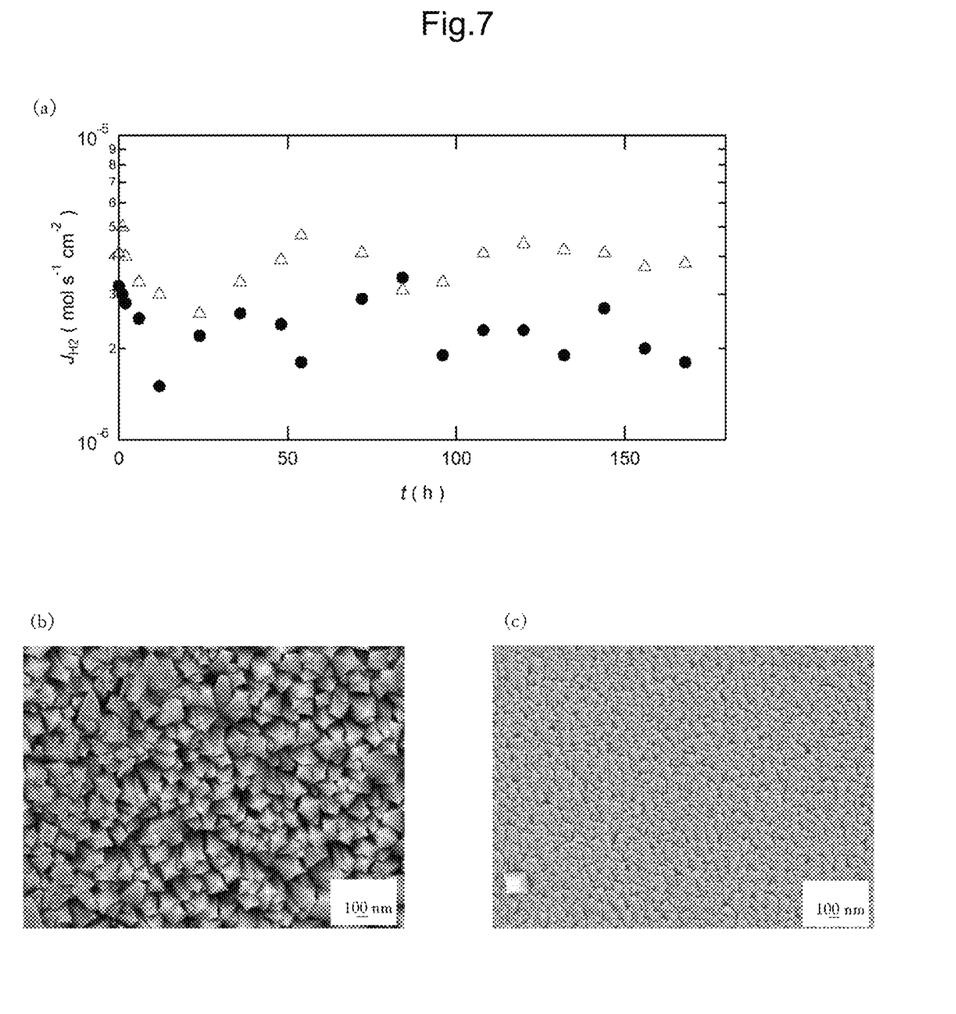
FIG. 7 shows (a) the permeation flux change (Δ: room temperature result, • 300° C. result), (b) membrane surface SEM photograph prior to hydrogen permeation test at 300° C., and (c) membrane surface SEM photograph after hydrogen permeation test at 300° C.

(111) Orientation $TiN_{0.7}$ prepared at a substrate temperature of 20° C. in Example 1 was subjected to hydrogen permeation test at room temperature (25° C.) or 300° C. for 1 week. The transmission flux change is shown in FIG. 7(a). Δ is the result at room temperature, and • is the result at 300° C. A SEM-photograph of membrane surfaces prior to hydrogen permeation test at 300° C. is shown in FIG. 7(b). A SEM-photograph of membrane surface after hydrogen permeation test at 300° C. is shown in FIG. 7(c).

The experimental conditions are as follows.
Temperature: Room temperature (25° C.) or 300° C. constant
Hydrogen Pressure: 50%-$H_2$/$N_2$ (101.3 kPa; 50 sccm)
Outlet Ar (101.3 kPa; 20 sccm)
Detection of Hydrogen Flux: Determination of the hydrogen concentration of the exit-side gas by gas chromatography
Membrane Shape: Membrane of 600 nm in thickness was made on a porous alumina substrate (16 mmΦ)
Sample: $TiN_{0.7}$-20 of Example 1

These results indicate that the hydrogen-flux remained stable for the duration of the 1-week test (FIG. 7(a)) and that no crack and the like on the membrane occurred (FIGS. 7(b) and (c)).

In the above example, a TiN membrane is described as an example of the $TiN_x$. Metal nitride of which metal element M is Hf, Ta, Mo, Cr, V and Zr other than Ti, as in TiN, have Fermi energy higher than −4.4 eV vs L.V. Thus, when hydrogen is introduced, the hydrogen acts as an acceptor rather than a donor, thus creating hydride ion defects ($H^-$). This is because the energy of electrons in metal nitride is relatively higher than that of 1 s electron in a hydrogen atom, so the electron moves from metal nitride to 1 s orbital of hydrogen. The above hydrogen acceptor generation reaction is represented by the following Kroger-Vink defective formula:

$$M_M^x + \tfrac{1}{2}H_2 + e' \rightarrow (MH)'\qquad(x)$$

In formula (x), the upper superscripts x and ' represent the 0 and −1 valences, and the lower subscript M represents the crystal sites of the metal M.

It is speculated that the (111) orientation $MN_x$ membrane can provide a hydrogen membrane which produces very high hydrogen flux by making it a thin film of crystallite sizes of several nanometers or less.

INDUSTRIAL APPLICABILITY

The present invention is useful in the field of hydrogen permeation membrane.

The invention claimed is:

1. A membrane for hydrogen separation comprising a polycrystalline substance membrane comprising particles of a metal nitride represented by the general formula MNx, wherein M is a metal element of which metal nitride exhibits Fermi energy of higher than −4.4 eV vs L.V., and x is within the range where rock salt structure is adopted, wherein crystallite size determined by transmission electron microscopy observation is 5 nm or less, at least a part of the crystallite has rock salt structure, the crystallite exhibits (111) orientation but substantially no (100) orientation.

2. A method for production of the membrane for hydrogen separation according to claim 1, comprising forming by sputtering onto a substrate at a temperature of less than 20° C., a polycrystalline substance membrane comprising metal nitride particles represented by the general formula MNx, wherein M is a metal element of which metal nitride exhibits Fermi energy of higher than −4.4 eV vs V.L. and x is within the range where rock salt structure is adopted, at least a portion of crystallite has rock salt structure, and the crystallite exhibits (111) orientation but substantially no (100) orientation.

3. The method for production according to claim 2, wherein the substrate is a porous substance.

4. The membrane for hydrogen separation according to claim 1, wherein M is at least one metal selected from the group consisting of Ti, Hf, Ta, Mo, Cr, V and Zr.

5. The membrane for hydrogen separation according to claim 1, wherein M is Ti and x is 0.5 or more and 1.0 or less.

6. The membrane for hydrogen separation according to claim 1, wherein the polycrystalline substance membrane comprises hydride ion ($H^-$).

7. The membrane for hydrogen separation according to claim 1, wherein the membrane comprises the polycrystalline substance membrane on a substrate.

8. The membrane for hydrogen separation according to claim 7, wherein the substrate is a porous alumina substrate.

9. The membrane for hydrogen separation according to claim 8, wherein the porous alumina substrate is a porous alumina substrate surface modified with a mesoporous γ $Al_2O_3$ layer.

10. The membrane for hydrogen separation according to claim 1, wherein the polycrystalline substance membrane has a thickness of from 100 nm to 5000 nm.

11. The membrane for hydrogen separation according to claim 5, wherein atomic ratio O/Ti of the polycrystalline substance membrane is 0.1 or less.

12. The method for production according to claim 2, wherein the substrate is a porous alumina substrate.

13. The method for production according to claim 12, wherein the porous alumina substrate is a porous alumina substrate surface modified with a mesoporous γ $Al_2O_3$ layer.

14. A method for separation of hydrogen from a gas mixture comprising:
exposing the gas mixture comprising hydrogen to a polycrystalline substance membrane comprising particles of a metal nitride represented by the general formula MNx, wherein MN is a metal nitride of which Fermi energy is higher than −4.4 eV vs L.V., and x is within the range where rock salt structure is adopted, wherein crystallite size determined by transmission electron microscopy observation is 5 nm or less, at least a part of the crystallite has rock salt structure, the crystallite exhibits (111) orientation but substantially no (100) orientation.

15. The method for separation of hydrogen according to claim 14, wherein M is at least one metal selected from the group consisting of Ti, Hf, Ta, Mo, Cr, V and Zr.

16. The method for separation of hydrogen according to claim 14, wherein M is Ti and x is 0.5 or more and 1.0 or less.

17. The method for separation of hydrogen according to claim 14, wherein the polycrystalline substance membrane comprises hydride ion ($H^-$).

18. The method for separation of hydrogen according to claim 14, wherein the membrane comprises the polycrystalline substance membrane on a substrate.

* * * * *